(12) United States Patent
Otani et al.

(10) Patent No.: US 10,830,972 B2
(45) Date of Patent: Nov. 10, 2020

(54) OPTICAL CONNECTOR, ELECTRONIC APPARATUS AND OPTICAL INTERCONNECTION SYSTEM

(71) Applicant: SONY CORPORATION, Tokyo (JP)

(72) Inventors: Eiji Otani, Kanagawa (JP); Shuichi Oka, Kanagawa (JP); Hiizu Ootorii, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/072,229

(22) PCT Filed: Dec. 20, 2016

(86) PCT No.: PCT/JP2016/087907
§ 371 (c)(1),
(2) Date: Jul. 24, 2018

(87) PCT Pub. No.: WO2017/134953
PCT Pub. Date: Aug. 10, 2017

(65) Prior Publication Data
US 2019/0064458 A1    Feb. 28, 2019

(30) Foreign Application Priority Data
Feb. 1, 2016    (JP) .................................. 2016-016949

(51) Int. Cl.
*G02B 6/42* (2006.01)
*H01L 31/02* (2006.01)
*G02B 6/43* (2006.01)

(52) U.S. Cl.
CPC .......... *G02B 6/4278* (2013.01); *G02B 6/4204* (2013.01); *G02B 6/4246* (2013.01);
(Continued)

(58) Field of Classification Search
CPC .. G02B 6/4278; G02B 6/4246; G02B 6/4292; G02B 6/4204; G02B 6/4261;
(Continued)

(56) References Cited

U.S. PATENT DOCUMENTS 7,854,554 B1    12/2010 Karnopp et al.
2008/0191236 A1*   8/2008 De Graaf ............ F28D 15/0233
                                                    257/99
(Continued)

FOREIGN PATENT DOCUMENTS

JP    H11-345987    12/1999
JP    2003-172854    6/2003
(Continued)

OTHER PUBLICATIONS

International Search Report prepared by the Japan Patent Office on Mar. 1, 2017, for International Application No. PCT/JP2016/087907.

*Primary Examiner* — Ryan A Lepisto
*Assistant Examiner* — Erin D Chiem
(74) *Attorney, Agent, or Firm* — Sheridan Ross P.C.

(57) ABSTRACT

An optical connector includes a core block, a flexible wiring board, an optical device array, a drive circuit, and a housing. The core block has a plurality of faces. The flexible wiring board has an external connection terminal, a first area arranged on a first face of the core block, and a second area arranged on a second face of the core block. The optical device array is mounted on the first area of the flexible wiring board and includes at least one group of a plurality of optical devices for transmission and a plurality of optical devices for reception arranged. The drive circuit is mounted on the second area of the flexible wiring board and drives the optical device array. The housing stores the core block, the optical device array, and the drive circuit such that the
(Continued)

external connection terminal of the flexible wiring board is arranged outside the housing.

20 Claims, 6 Drawing Sheets

(52) U.S. Cl.
CPC ......... *G02B 6/4261* (2013.01); *G02B 6/4268* (2013.01); *G02B 6/4269* (2013.01); *G02B 6/4281* (2013.01); *G02B 6/4292* (2013.01); *G02B 6/43* (2013.01); *H01L 31/02* (2013.01); *G02B 2006/4297* (2013.01)

(58) Field of Classification Search
CPC .. G02B 6/4268; G02B 6/4269; G02B 6/4281; G02B 6/43; G02B 6/4297; H01L 31/02
See application file for complete search history.

(56) References Cited

U.S. PATENT DOCUMENTS

| | | | |
|---|---|---|---|
| 2012/0207427 A1 | 8/2012 | Ito | |
| 2014/0284463 A1 | 9/2014 | Kuroda et al. | |

FOREIGN PATENT DOCUMENTS

| | | |
|---|---|---|
| JP | 2003-270493 | 9/2003 |
| JP | 2008-118357 | 5/2008 |
| JP | 2012-137537 | 7/2012 |
| JP | 2012-168253 | 9/2012 |
| WO | WO 2013/065584 | 5/2013 |

\* cited by examiner

A

B

OPTICAL CONNECTOR, ELECTRONIC APPARATUS AND OPTICAL INTERCONNECTION SYSTEM

CROSS REFERENCE TO RELATED APPLICATIONS

This application is a national stage application under 35 U.S.C. 371 and claims the benefit of PCT Application No. PCT/JP2016/087907 having an international filing date of 20 Dec. 2016, which designated the United States, which PCT application claimed the benefit of Japanese Patent Application No. 2016-016949 filed 1 Feb. 2016, the entire disclosures of each of which are incorporated herein by reference.

TECHNICAL FIELD

The present technology relates an optical connector or the like that transmits an optical signal.

BACKGROUND ART

A receptacle module described in Patent Literature 1 includes inside a fiber mounting region on which two optical fibers for transmission and reception are mounted. An optical link module includes light-emitting devices and light-receiving devices. With the optical link module being connected to the receptacle module, the light-emitting devices and the light-receiving devices are arranged to face the optical fibers. The light-emitting devices and the light-receiving devices are mounted on a center of a rigid flexible board and the optical link module stores these components to a housing (for example, see Patent Literature 1, specification, paragraphs [0024], FIGS. 1 and 4.).

An optical connector described in Patent Literature 2 includes a photoelectric conversion circuit board on which a photoelectric conversion device is mounted, a resin member into which a ferrule mounted on ends of optical fibers is fit, and a housing that stores these components. A lens arranged at a position facing to the photoelectric conversion device is integrally formed with the resin member (for example, see Patent Literature 2, abstract, FIG. 4).

CITATION LIST

Patent Literature

Patent Literature 1: Japanese Patent Application Laid-open No. 11-345987
Patent Literature 2: Japanese Patent Application Laid-open No. 2012-137537

DISCLOSURE OF INVENTION

Technical Problem

In recent years, as image and sound quality of contents becomes higher, data traffic is increased. Accordingly, an interface capable of transmitting high capacity data is necessary. At the same time, downsizing an optical connector used as the interface is also necessary.

An object of the present disclosure to provide a downsized optical connector and an electronic apparatus and an optical interconnection system including the same.

Solution to Problem

In order to achieve the above-described object, an optical connector according to an embodiment includes a core block, a flexible wiring board, an optical device array, a drive circuit, and a housing.

The core block has a plurality of faces.

The flexible wiring board has an external connection terminal, a first area arranged on a first face of the plurality of faces of the core block, and a second area arranged on a second face of the plurality of faces of the core block.

The optical device array is mounted on the first area of the flexible wiring board and includes at least one group of a group including a plurality of optical devices for transmission and a group including a plurality of optical devices for reception arranged.

The drive circuit is mounted on the second area of the flexible wiring board and drives the optical device array.

The housing stores the core block, the optical device array, and the drive circuit such that the external connection terminal of the flexible wiring board is arranged outside the housing.

The optical device array includes at least one group of a group including a plurality of optical devices for transmission and a group including a plurality of optical devices for reception arranged, i.e., is a device capable of transmitting data with a plurality of channels (multiple channels). In such a structure with the plurality of channels, the optical device array and the drive circuit are mounted on (the flexible wiring board of) individual faces of the core block and these components are stored in the housing. Specifically, since the core block, the optical device array including the plurality of channels, and the drive circuit are integrally stored in the housing, the optical connector can be downsized.

The optical connector may further include a second drive circuit that drives the optical device array. The core block may further have a third face and a fourth face, and the flexible wiring board may further have a third area arranged on the third face on which the second drive circuit is mounted.

Thus, since two or more drive circuits are arranged on the respective faces of the core block, the optical connector can be downsized.

The optical connector may further include a heat dissipation mechanism thermally connected to the core block.

Thus, a heat dissipation efficiency of (the optical device array and the drive circuit of) a plurality of channels (multiple channels) transmission type optical connector can be increased.

In addition, the heat dissipation mechanism can uniformly cool the optical device array and the two or more drive circuits.

The heat dissipation mechanism may be a heat dissipation fin arranged on the fourth face of the core block.

Since the heat dissipation fin is arranged at the fourth face on which no optical device array and no drive circuit are arranged, both of downsizing and the heat dissipation structure can be achieved.

The heat dissipation mechanism may be a heat pipe connected to the core block.

The core block may has a structure that the first face and the fourth face are arranged facing to each other, the second face and the third face are arranged facing to each other, and a distance between the second face and the third face is smaller than a distance between the first face and the fourth face.

This allows the thickness of the optical connector in the direction along the distance between the first face and the fourth face to be thin.

The core block may be slidable along a direction perpendicular to an arrangement direction of the optical devices of the optical device array in the housing.

Thus, for example, in a case where a connector of a partner device connected to the optical connector is mounted on the housing of the optical connector, the core block can be pressed by a substantially constant pressing force. This allows the components to be protected from a breakage or a damage.

A length of a transmission path between each terminal of the plurality of optical devices and each terminal of the drive circuit may be 2 mm or less.

This allows signal transmission quality between the drive circuit and the optical devices to be improved.

An electronic apparatus according to an embodiment includes the above-described optical connector.

An optical interconnection system according to an embodiment include an optical receptacle module to which the above-described optical connector is applied and an optical plug module connectable to the optical receptacle module, the optical receptacle module.

Advantageous Effects of Invention

As described above, according to the present technology, a multiple channel transmission type optical connector can be downsized.

It should be noted that the effects described here are not necessarily limitative and may be any of effects described in the present disclosure.

MODE(S) FOR CARRYING OUT THE INVENTION

Hereinafter, embodiments of the present technology will be described with reference to the drawings.

1. First Embodiment 1. 1) Optical Interconnection System

Figure 1:
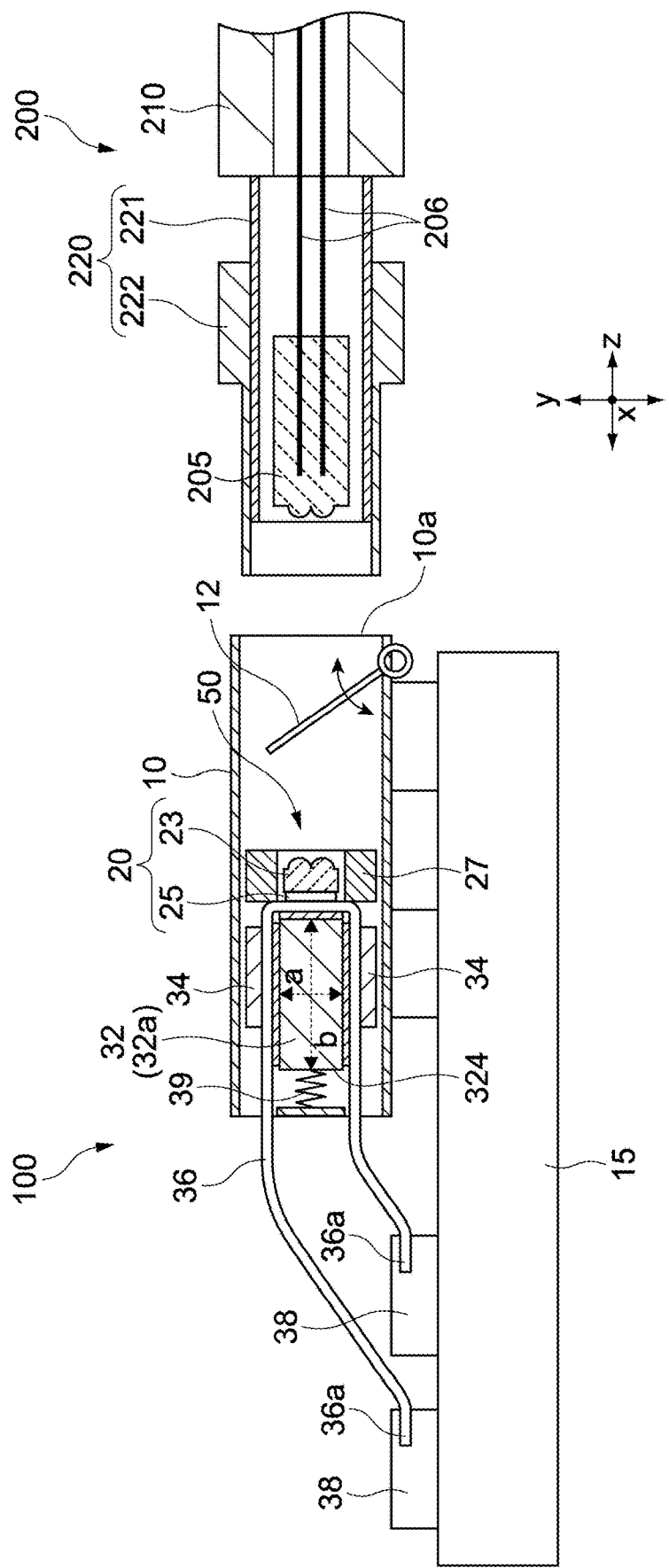
FIG. 1 is a view showing an optical interconnection system according to an embodiment of the present technology.

FIG. 1 is a view showing an optical interconnection system according to an embodiment of the present technology. FIG. 1 schematically shows lateral cross-sectional views of an optical receptacle module 100 and an optical plug module 200. The optical interconnection system includes the optical receptacle module 100 (optical connector) and the optical plug module 200 connectable to the optical receptacle module 100.

As descried later, the optical receptacle module 100 is a module mounted on an electronic apparatus such as a PC (Personal Computer) and the like. The optical plug module 200 is typically mounted on a cable that connects the electronic apparatus to an external device.

1. 2) Optical Plug Module

As shown in FIG. 1, the optical plug module 200 includes a plug housing 210 and a plug body 220 protruded from the plug housing 210. The plug body 220 includes a storage 221 and a plug cover 222 attached to an outer face of the storage 221. The plug cover 222 fits into a housing 10 of the optical receptacle module 100 described later, whereby the optical plug module 200 is connected to the optical receptacle module 100.

The storage 221 of the plug body 220 includes a plurality of optical fibers 206 that can be mated with (faced to) an optical device array 25 of an optical receptacle module 100 described later.

As shown in FIG. 1, the storage 221 of the plug body 220 includes a resin lens 205 arranged at ends of the plurality of optical fibers 206. A front face of the storage 221 is open and a shutter (not shown) may be arranged at the opening.

1. 3) Optical Receptacle Module

Figure 2:
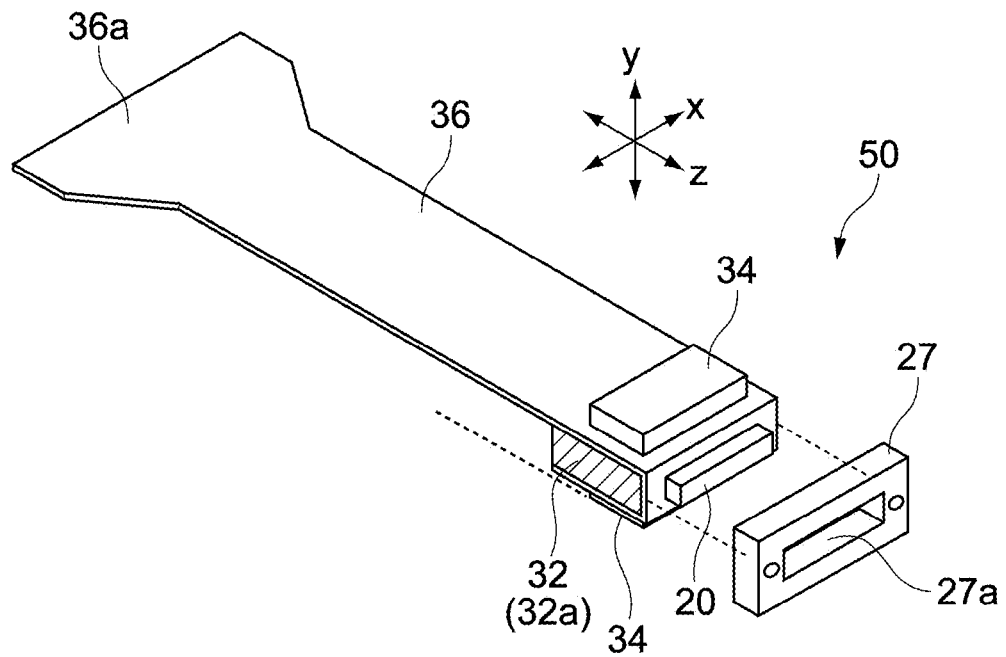
FIG. 2A is a perspective view schematically showing an internal unit.
FIG. 2B shows a guard member and an optical device array unit viewed from a front face.
Figure 2:
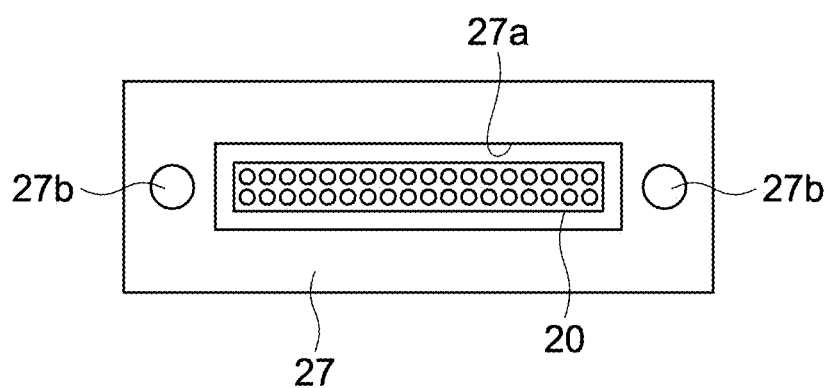
Figure 3:
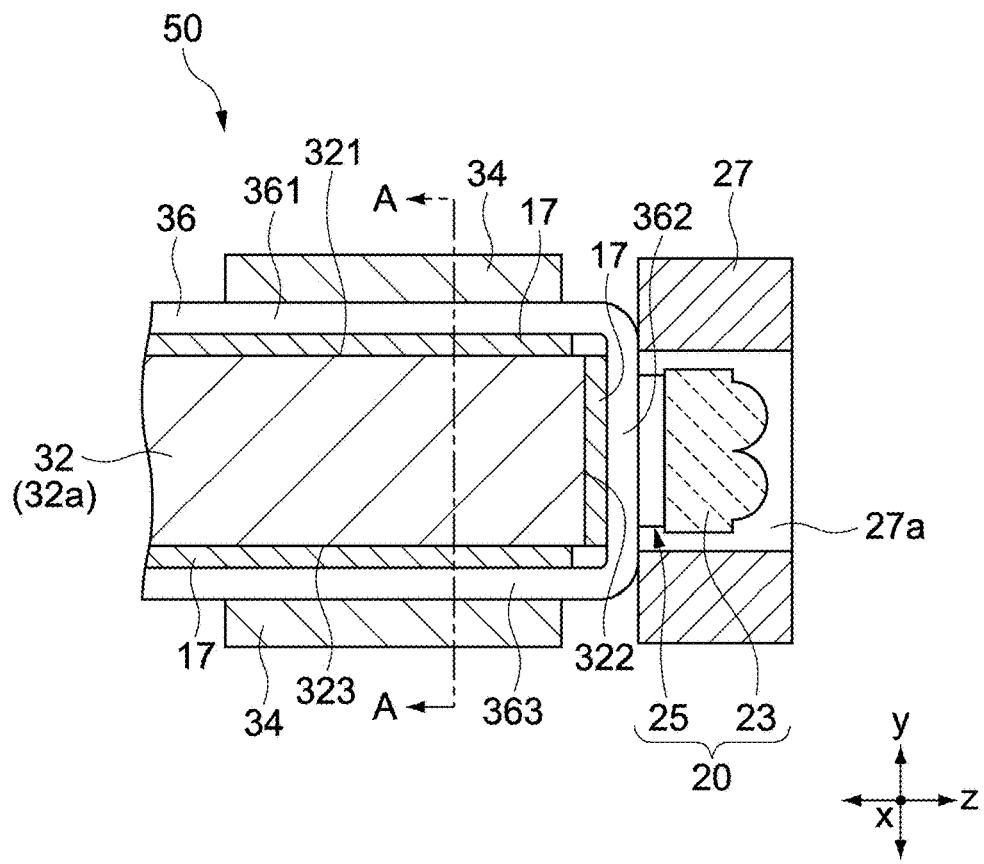
FIG. 3 is an enlarged view showing the internal unit of FIG. 1.

As shown in FIG. 1, the optical receptacle module 100 includes a housing 10 and an internal unit 50 arranged in the housing 10. FIG. 2A is a perspective view schematically showing the internal unit 50. FIG. 3 is an enlarged view showing the internal unit 50 of FIG. 1.

The housing 10 has a structure that a part of the plug body 220 of the optical plug module 200 can be inserted and fit into the housing 10. As the fitting structure, a variety of structures including a protrusion or groove engagement structure and a locking structure with a flat spring may be used.

An opening 10a is arranged at a front side of the housing 10 and is covered with a shutter 12. The shutter 12 has a structure that closes the opening 10a by using spring force (not shown). In a case where the optical plug module 200 is connected to the optical receptacle module 100, the plug body 220 resists to the spring force of the shutter 12, pushes down the shutter 12, and is inserted into the housing 10.

In this specification, an axis of a direction that the optical plug module 200 is inserted into and removed from the optical receptacle module 100 (left and right direction of FIG. 1) is denoted by a z axis, and two axes perpendicular to the z axis are denoted as x and y axes for convenience of description.

The internal unit 50 includes a core block 32, an optical device array unit 20, driver ICs (drive circuits) 34, and a guard member 27.

The core block 32 has a region 32a having a plurality of faces and a substantial rectangular parallelepiped shape, for example. As shown in FIG. 3, the core block 32 has a top face 321 forming a first face, a front face 322 forming a second face perpendicular to the top face 321, and a bottom face 323 forming a third face in parallel with the top face 321, for example. Also, the core block 32 has a rear face 324 forming a fourth face in parallel with the front face 322.

The core block 32 may have a solid structure or may have a hollow structure. A desirable material of the core block 32 has high thermal conductivity such as a metal material in order to provide a heat dissipation function as described later. Examples of the metal material include aluminum, copper, and the like.

A flexible wiring board 36 is arranged on the core block 32 by folding over along the top face 321, the front face 322, and the bottom face 323. Specifically, guide plates 17 are respectively attached to the top face 321, the front face 322, and the bottom face 323 of the core block 32, and the flexible wiring board 36 is adhered to the guide plates 17.

The flexible wiring board 36 has a first area 361 arranged on the top face 321 of the core block 32, a second area 362 arranged on the front face 322 of the core block 32, and a third area 363 arranged on the bottom face 323 of the core block 32. The optical device array unit 20 has an optical device array 25 and a lens member 23 arranged at the front thereof. The optical device array 25 is mounted on the second area 362 of the flexible wiring board 36. The driver ICs 34 that drive the optical device array 25 are respectively mounted on the first area 361 and the third area 363 of the flexible wiring board 36.

Figure 4:
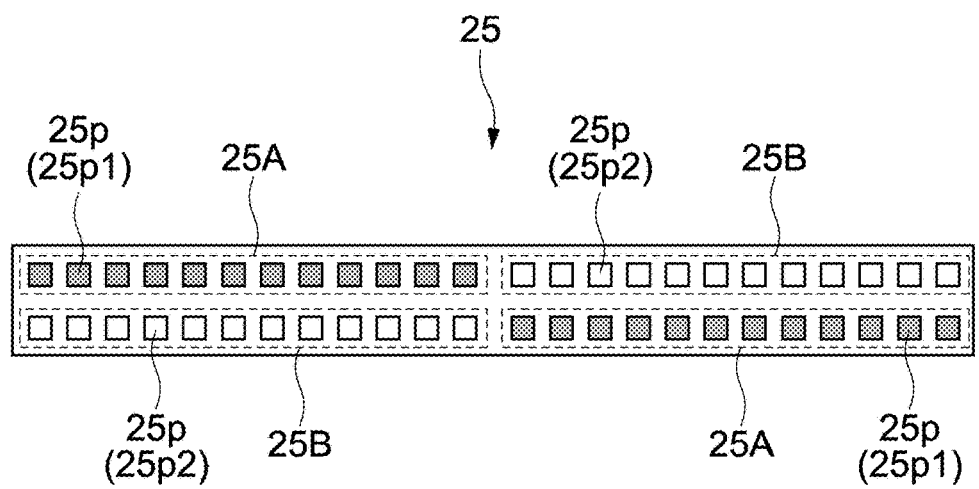
FIG. 4 shows an optical device array viewed from the front.

FIG. 4 shows the optical device array 25 viewed from the front (from the z direction). The optical device array 25 includes a plurality of optical devices 25p two-dimensionally arranged, for example. The plurality of optical devices 25p are divided into a group 25A including a plurality of optical devices 25p1 for transmission and a group 25B including a plurality of optical devices 25p2 for reception. In other words, there are a plurality of transmission (multiple) channels and a plurality of reception (multiple) channels.

For example, one group 25A including transmission optical devices has twelve optical devices 25p1 for transmission. There are two groups 25A including the transmission optical devices. Similarly, one group 25B including reception optical devices has twelve optical devices 25p2 for reception. There are two groups 25B including the reception optical devices. In order to correspond to a reversible connection to the optical plug module 200 and the optical receptacle module 100, two of each of the groups 25A including the transmission optical devices and the groups 25B including the reception optical devices are rotationally symmetrically arranged in this manner. As a result, the optical receptacle module 100 includes 48 optical devices 25p in total. The number of channels for transmission is 12 and the number of channels for reception is 12. Similarly, the optical plug module 200 includes 48 optical fibers 206 correspondingly.

Typically, the optical device 25p for transmission is a semiconductor light emitting device, for example, an LED (Light Emitting Diode) or an LD (Laser Diode). The optical device 25p for reception is, for example, a PD (Photo Diode).

The lens member 23 of the optical device array unit 20 has a function to convert the light coupled between the optical receptacle module 100 and the optical plug module 200 into parallel light.

As shown in FIG. 1, the optical receptacle module 100 is arranged on a print board 15. Connector components 38 are mounted on the printed board 15 at the rear of the housing 10. Terminals 36a of the flexible wiring board 36 are drawn outside the housing 10 and are connected to the connector components 38.

As shown in FIG. 2A and FIG. 3, the guard member 27 having an opening 27a is arranged at the front face 322 of the core block 32. FIG. 2B shows the guard member 27 and the optical device array unit 20 viewed from the front face 322 (from the z direction). The guard member 27 is attached to (the flexible wiring board 36) on the front face 322 of the core block 32 such that the optical device array unit 20 faces forward via the opening 27a.

In a case where the optical plug module 200 is connected to the optical receptacle module 100, the guard member 27 has a function to protect the optical device array unit 20 from colliding with the plug body 220.

As shown in FIG. 2B, positioning structures 27b are arranged at both ends of the front face 322 of the guard member 27 in the longitudinal direction (x direction). The positioning structures 27b are, for example, holes or pins. By engaging with pins or holes of the optical plug module 200, the optical receptacle module 100 and the optical plug module 200 are positioned mainly in an x-y plane.

Figure 5:
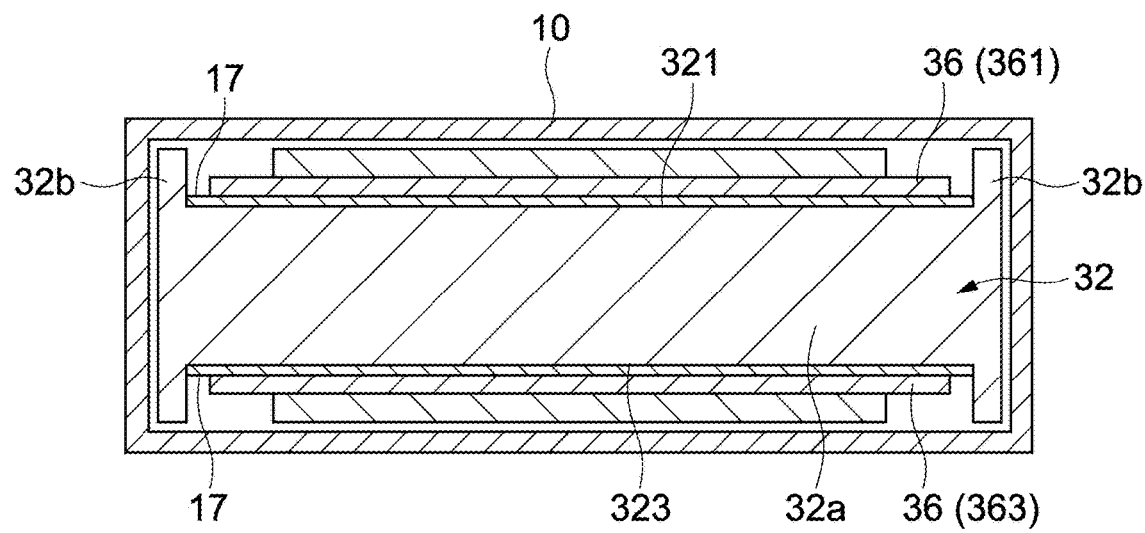
FIG. 5 is a cross-sectional view taken along the line A-A of FIG. 3.

FIG. 5 is a cross-sectional view taken along the line A-A of FIG. 3. The internal unit 50 is not fixed in the housing 10 in the z direction and is slidable along the z axis in the housing 10 (along the direction perpendicular to an arrangement direction of the optical devices of the optical device array 25).

Specifically, the core block 32 has guides 32b arranged at the both sides in the x direction in addition to the region 32a having a rectangular parallelepiped shape. The guides 32b protrude higher than the top face 321 and lower than the bottom face 323. Each guide 32b has a length in the y direction closer to the length in the y direction inside the housing 10. In this manner, it is possible to move the internal unit 50 substantially only in the z direction.

As shown in FIG. 1, an elastic member 39 is arranged between the rear face 324 of the core block 32 and the rear face 324 of the housing 10. The elastic member 39 is a coil spring but may be instead a flat spring. The elastic member 39 positions the internal unit 50 to the housing 10 in the z direction in a free state with no elastic force, for example. Alternatively, by arranging a stopper (not shown) that limits a forward movement (right direction of FIG. 1) of the internal unit 50 in the housing 10, the internal unit 50 may be positioned in the z direction in a state that the elastic member 39 has some elastic force. In a case where the optical plug module 200 is connected to the optical receptacle module 100, the plug body 220 comes in contact with the guard member 27 while pressing the internal unit 50 against the elastic force of the elastic member 39.

Note that the elastic member 39 may not be present. In this case, a stopper that limits forward and backward movements of the core block 32 along the z axis may be provided in the housing 10.

1. 4) Summary

As described above, the optical device array 25 includes a plurality of optical devices for transmission and a plurality of optical devices for reception. In other words, the optical device array 25 is a device capable of transmitting data with multiple channels. In such a multiple channel transmission type structure, the optical device array 25 and the driver ICs 34 are mounted on (the flexible wiring board 36 of) individual faces of the core block 32 and these components are stored in the housing 10. Specifically, since the core block 32, the optical device array 25 including a plurality of channels, and the driver ICs 34 are integrally stored in the housing 10, a high capacity data transmission is achieved and the optical receptacle module 100 can be downsized at the same time.

The optical receptacle module 100 according to this embodiment does not have the structure that photoelectric conversion components and connectors are physically separated and connected via optical fibers like the optical connector module in the related art but has the structure that multiple channel transmission type interfaces are physically integrated. Accordingly, the optical receptacle module 100 can be downsized and routing of the optical fibers is unnecessary.

In addition, two driver ICs 34 are respectively arranged on the top face 321 and the bottom face 323 of the core block 32. This contributes to downsizing of the optical receptacle module 100.

In particular, since only the optical device array 25 (optical device array unit 20) is arranged on the front face 322 of the core block 32 as a main component, the optical receptacle module 100 can have a low height. In addition, as shown in FIG. 1, the core block 32 has a structure that a distance a between the top face 321 and the bottom face 323 is smaller than a distance b between the front face 322 and the rear face 324. Thus, by the setting of b/a>1, the optical receptacle module 100 has a low height.

In this embodiment, since the core block 32 can be assembled physically separated from the housing 10 (see FIG. 2), assembling is easy and components can be easily replaced upon failure.

Light output from the optical device array unit 20 is substantially directly coupled to optical components of the optical plug module 200 via the guard member 27. Accordingly, an optical loss can be decreased.

The internal unit 50 arranged is slidable in the housing 10. Accordingly, in a case where the optical plug module 200 is mounted on the housing 10 of the optical receptacle module 100, the core block 32 can be pressed by a substantially constant pressing force. This allows the components to be protected from a breakage or a damage.

In addition, the elastic member 39 is arranged between the housing 10 and the core block 32, and the optical plug module 200 (plug body 220) comes in contact with the guard member 27 against the elastic force of the elastic member 39. As a result, the plug body 220 and the guard member 27 always maintain the contact state and are reliably positioned in the z direction.

2. Second Embodiment

Next, an optical receptacle module according to a second embodiment of the present technology will be described. The optical receptacle module according to the second embodiment further includes a heat dissipation mechanism thermally connected to the core block.

In the following description, elements of the components, the functions and the like substantially similar to those included in the optical receptacle module 100 according to the first embodiment are denoted by the similar reference signs, description thereof will be omitted or simplified, and different points will be mainly described.

Figure 6:
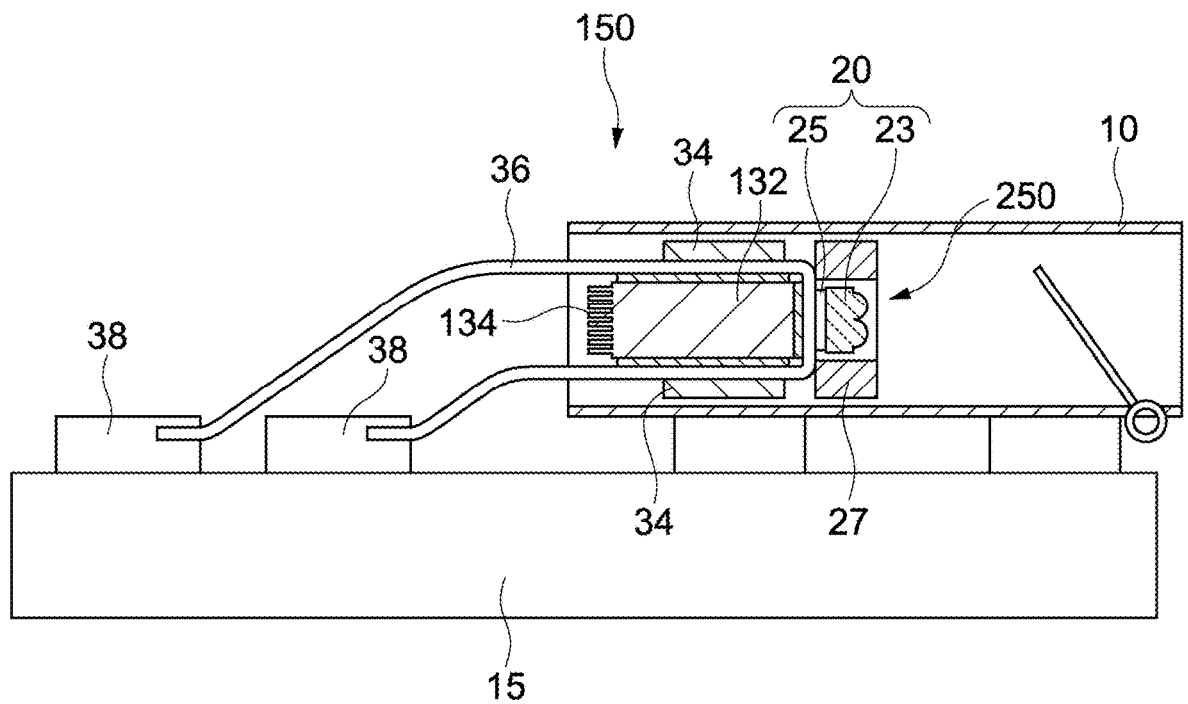
FIG. 6 is a cross-sectional view showing an optical receptacle module including a core block having a heat dissipation fin as a heat dissipation mechanism.

2. 1) Optical Receptacle Module Including Heat Dissipation Fin as Heat Dissipation Mechanism FIG. 6 is a cross-sectional view showing an optical receptacle module 150 according to this embodiment. An internal unit 250 includes a core block 32 including a heat dissipation fin (heat sink) 132 as a heat dissipation mechanism. The heat dissipation fin 134 is arranged at the rear face of the core block 132.

As described above, a material having high thermal conductivity is used for the core block 132. The heat dissipation fin 134 is formed of the same material as the core block 132 and arranged integrally with the core block 132. Alternatively, the heat dissipation fin 134 may be attached to the core block 132 as a separate component from the core block 132. A linear expansion coefficient difference between the core block 132 and the flexible wiring board 36 is taken into consideration. The linear expansion coefficient difference of aluminum is close to that of polyimide or epoxy resin, for example. The suitable material of the core block 132 is aluminum.

Since the plurality of optical devices are used in the multiple channel type module, an amount of heat generation is correspondingly increased. By arranging the heat dissipation fin 134, a heat dissipation efficiency can be increased.

In particular, since the two driver ICs 34 are arranged at the top face and the bottom face of the core block 132 and the heat dissipation fin 134 is arranged at the rear face, both of downsizing and the heat dissipation structure can be achieved.

In addition, the core block 132 including the heat dissipation fin 134 can uniformly cool the optical device array 25 and the two drivers IC 34. There is a great advantage of using the heat dissipation fin having this structure in the multiple channel transmission type structure.

In addition, by setting the aspect ratio of the core block 132 to b/a>1, the temperature gradient of the front face of the core block 132 can be lower than the temperature gradient of each of the top face and the bottom face. As a result, operations of light emission and light reception by the optical device array 25 having a semiconductor structure can be stabilized and made uniform among the plurality of optical devices. In this manner, an optical interconnection system that is stable in a broadband can be achieved.

Note that, also in this embodiment, similar to the first embodiment, the elastic member that generates the elastic force in the z direction may be arranged between the core block 132 and the housing 10.

In addition to or instead of the heat dissipation fin 134, a heat dissipation sheet (heat spreader) (not shown) may be arranged at any position of the core block 132.

Figure 7:
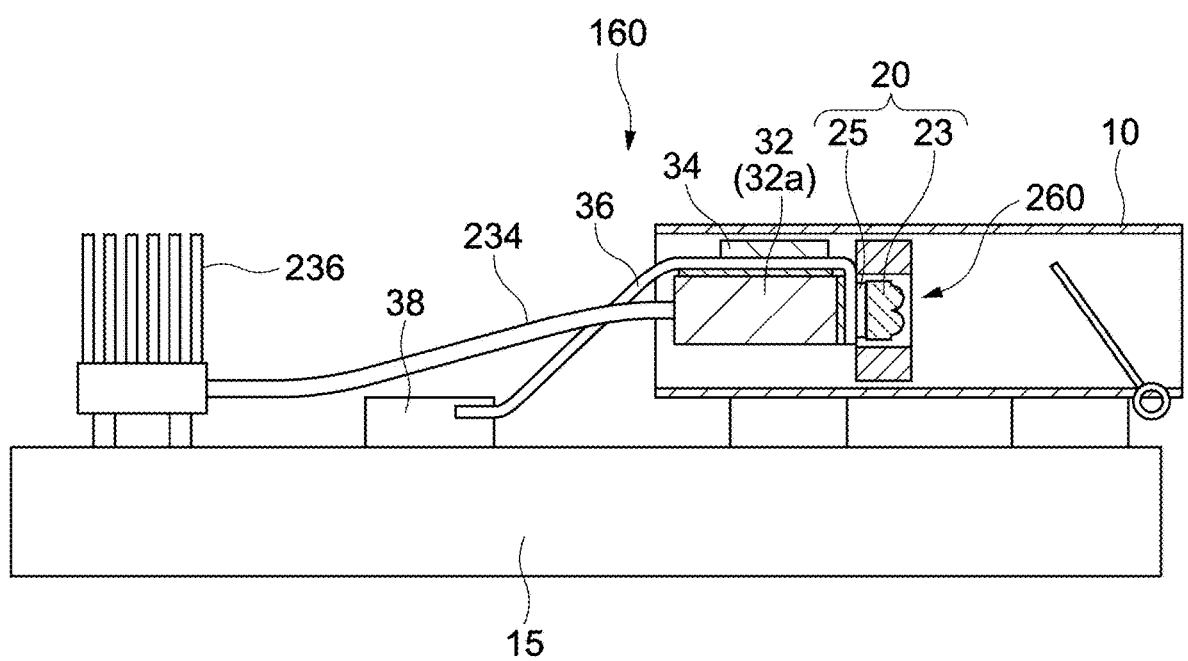
FIG. 7 is a cross-sectional view showing an optical receptacle module including a core block to which a heat pipe is connected as a heat dissipation mechanism.

2. 2) Optical Receptacle Module Including Heat Pipe as Heat Dissipation Mechanism FIG. 7 is a cross-sectional view showing an optical receptacle module 160 according to this embodiment. An internal unit 260 includes a core block 32 to which a heat pipe 234 is connected as the heat dissipation mechanism. An evaporator of the heat pipe 234 is connected to the core block 32 and a condenser arranged at the opposite side is connected to a heat dissipation structure (for example, heat sink 236) distant from the internal unit 250. With this structure, although the apparatus is enlarged just for the heat sink 236, a high cooling efficiency can be achieved.

Note that, in the optical receptacle module 160 according to this embodiment, the driver IC 34 is arranged only at the top face of the core block 32. Alternatively, similar to the embodiment shown in FIGS. 3 and 6, the driver IC 34 may also be arranged at the bottom face.

3. Transmission Path Length Between Optical Device Array and Driver IC

Next, in the optical receptacle module according to each embodiment, a transmission path length between a terminal of the optical device array 25 and a terminal of the driver IC 34.

Figure 8:
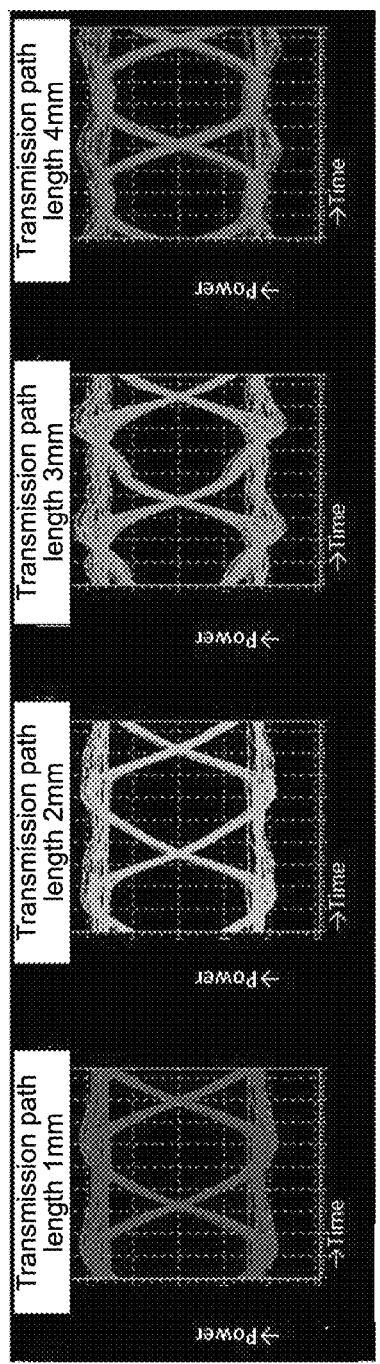
FIG. 8 shows results of electromagnetic field simulation by changing a transmission path length.

FIG. 8 shows results of electromagnetic field simulation by changing the transmission path length. Types of the transmission path length are 1 mm, 2 mm, 3 mm, and 4 mm from left in FIG. 8. From FIG. 8, the preferable transmission path length is 2 mm or less. In a case where the transmission path length is 3 mm or more, a rise shape of a waveform is distorted before it reaches a 0 level (lower level) or a 1 level (upper level). The results reveal that transmission properties are deteriorated.

Note that the simulation result of the transmission path length of 4 mm shows a good waveform at a glance. However, the transmission properties of the transmission path length of 3 mm or more are in fact most likely deteriorated taking manufacturing variations of the transmission path and the like into consideration.

It should be appreciated that it is possible to have the transmission length of 3 mm or more by using a circuit that inhibits signal degradation, i.e., using a circuit where input and output impedance is strictly adjusted upon transmission.

4. Other Various Embodiments

The present technology is not limited to the above-described embodiments and other various embodiments are possible.

In the description of the above-described respective embodiments, an illustrative module having the internal unit 50, 250, or 260 is the optical receptacle module. However, irrespective of kinds of a receptacle and a plug, the structure including the internal unit 50, 250, or 260 can be the optical connector.

The optical device array 25 includes both of the group 25A including the plurality of optical devices for transmission and the group 25B including the plurality of optical devices for reception but may includes either of the plurality of optical devices for transmission or reception. In addition, the optical connector according to the respective embodiments has the structure corresponding to the reversible connection but may have no such a structure.

In the above-described respective embodiments, the driver ICs 34 are arranged on the top face 321 and the bottom face 323 of the core block 32, respectively. In the embodiment shown in FIG. 7, the driver IC 34 is arranged only on the top face. Alternatively, the driver IC 34 may be arranged only on the bottom face of the core block.

The (main region 34A of) above-described core block 32 or 132 has the substantial rectangular parallelepiped shape. Alternatively, the core block may have a shape of pentagon or more (five faces or more) viewed from the cross section in the x direction of FIG. 1, for example.

Examples of the electronic apparatus on which the optical connector (for example, optical receptacle module 100) is mounted include a PC, a camera, a projector, a smartphone, a tablet, a server computer, a TV, a game machine, a recording machine, a robot, and the like.

It is possible to combine at least two features of the respective embodiments described above.

The present technology may also have the following structures.

(1)

An optical connector, including:

a core block having a plurality of faces;

a flexible wiring board having an external connection terminal, a first area arranged on a first face of the plurality of faces of the core block, and a second area arranged on a second face of the plurality of faces of the core block;

an optical device array mounted on the first area of the flexible wiring board, the optical device array including at least one group of a group including a plurality of optical devices for transmission and a group including a plurality of optical devices for reception arranged;

a drive circuit mounted on the second area of the flexible wiring board that drives the optical device array; and a housing that stores the core block, the optical device array, and the drive circuit such that the external connection terminal of the flexible wiring board is arranged outside the housing.

(2)

The optical connector according to (1) above, further including:

a second drive circuit that drives the optical device array, wherein the core block further has a third face and a fourth face, and the flexible wiring board further has a third area arranged on the third face on which the second drive circuit is mounted.

(3)

The optical connector according to (2) above, further including:

a heat dissipation mechanism thermally connected to the core block.

(4)

The optical connector according to (3) above, in which the heat dissipation mechanism is a heat dissipation fin arranged on the fourth face of the core block.

(5)

The optical connector according to (3) above, in which the heat dissipation mechanism is a heat pipe connected to the core block.

(6)

The optical connector according to (1) above, in which the core block further has a third face in parallel with the first face and a fourth face in parallel with the second face, the first face and the fourth face are arranged facing to each other, the second face and the third face are arranged facing to each other, and a distance between the second face and the third face is smaller than a distance between the first face and the fourth face.

(7)

The optical connector according to (1) or (6) above, further including a heat dissipation mechanism thermally connected to the core block.

(8)

The optical connector according to (1) or (6) above, in which the core block is slidable along a direction perpendicular to an arrangement direction of the optical devices of the optical device array in the housing.

(9)

The optical connector according to (1) above, in which a length of a transmission path between each terminal of the plurality of optical devices and each terminal of the drive circuit is 2 mm or less.

(10)

An electronic apparatus including an optical connector, in which the optical connector includes a core block having a plurality of faces, a flexible wiring board having an external connection terminal, a first area arranged on a first face of the plurality of faces of the core block, and a second area arranged on a second face of the plurality of faces of the core block, an optical device array mounted on the first area of the flexible wiring board, the optical device array including at least one group of a group including a plurality of optical devices for transmission and a group including a plurality of optical devices for reception arranged, a drive circuit mounted on the second area of the flexible wiring board that drives the optical device array, and a housing that stores the core block, the optical device array, and the drive circuit such that the external connection terminal of the flexible wiring board is arranged outside the housing.

(11)

An optical interconnection system, including an optical receptacle module and an optical plug module connectable to the optical receptacle module, in which the optical receptacle module includes a core block having a plurality of faces, a flexible wiring board having an external connection terminal, a first area arranged on a first face of the plurality of faces of the core block, and a second area arranged on a second face of the plurality of faces of the core block, an optical device array mounted on the first area of the flexible wiring board, the optical device array including at least one group of a group including a plurality of optical devices for transmission and a group including a plurality of optical devices for reception arranged, a drive circuit mounted on the second area of the flexible wiring board that drives the optical device array, and a housing to which the optical plug module is mountable that stores the core block, the optical device array, and the drive circuit such that the external connection terminal of the flexible wiring board is arranged outside the housing.

REFERENCE SIGNS LIST 10 housing
12 shutter
15 printed board
17 guide plate
20 optical device array unit
23 lens member
25 optical device array
25p optical devices
25A group including optical devices for transmission (plural optical devices for transmission)
25B group including optical devices for reception (plural optical devices for reception)
27 guard member
32, 132 core block
34 driver IC
36 flexible wiring board
36a terminal
38 connector component
39 elastic member
50, 250, 260 internal unit
100, 150, 160 optical receptacle module
134 heat dissipation fin
200 optical plug module
205 resin lens
206 optical fiber
210 plug housing
220 plug body
221 storage
222 plug cover
234 heat pipe
236 heat sink
321 top face
322 front face
323 bottom face
324 rear face
361 first area
362 second area
363 third area

What is claimed is:

1. An optical connector, comprising:
   a core block having a plurality of faces;
   a flexible wiring board having an external connection terminal, a first area arranged on a first face of the plurality of faces of the core block, and a second area arranged on a second face of the plurality of faces of the core block;
   an optical device array mounted on the first area of the flexible wiring board, the optical device array including at least one group of a group including a plurality of optical devices for transmission and a group including a plurality of optical devices for reception arranged;
   a drive circuit mounted on the second area of the flexible wiring board that drives the optical device array;
   a housing that stores the core block, the optical device array, and the drive circuit such that the external connection terminal of the flexible wiring board is arranged outside the housing; and
   a heat dissipation mechanism provided beneath the drive circuit and the second area of the flexible wiring board, in-line with the optical device array, the heat dissipation mechanism being thermally connected to the core block,
   wherein the heat dissipation mechanism is formed of a same metal material as the core block, and
   wherein the heat dissipation mechanism is separate from the housing and connected to a fourth face of the plurality of faces of the core block.

2. The optical connector according to claim 1, further comprising:
   a second drive circuit that drives the optical device array, wherein
   the core block further has a third face, and
   the flexible wiring board further has a third area arranged on the third face on which the second drive circuit is mounted.

3. The optical connector according to claim 1, wherein the heat dissipation mechanism is a heat dissipation fin.

4. The optical connector according to claim 1, wherein the heat dissipation mechanism is a heat pipe.

5. The optical connector according to claim 1, wherein the core block further has a third face in parallel with the first face and the fourth face is in parallel with the second face,
   the first face and the fourth face are arranged facing to each other, the second face and the third face are arranged facing to each other, and a distance between the second face and the third face is smaller than a distance between the first face and the fourth face.

6. The optical connector according to claim 1, wherein the core block is slidable along a direction perpendicular to an arrangement direction of the optical devices of the optical device array in the housing.

7. The optical connector according to claim 1, wherein a length of a transmission path between each terminal of the plurality of optical devices and each terminal of the drive circuit is 2 mm or less.

8. An electronic apparatus comprising an optical connector, wherein the optical connector comprises:
   a core block having a plurality of faces;
   a flexible wiring board having an external connection terminal, a first area arranged on a first face of the plurality of faces of the core block, and a second area arranged on a second face of the plurality of faces of the core block;

an optical device array mounted on the first area of the flexible wiring board, the optical device array including at least one group of a group including a plurality of optical devices for transmission and a group including a plurality of optical devices for reception arranged;
a drive circuit mounted on the second area of the flexible wiring board that drives the optical device array;
a housing that stores the core block, the optical device array, and the drive circuit such that the external connection terminal of the flexible wiring board is arranged outside the housing; and
a heat dissipation mechanism provided beneath the drive circuit and the second area of the flexible wiring board, in-line with the optical device array, the heat dissipation mechanism being thermally connected to the core block,
wherein the heat dissipation mechanism is formed of a same metal material as the core block, and
wherein the heat dissipation mechanism is separate from the housing and connected to a fourth face of the plurality of faces of the core block.

9. An optical interconnection system, comprising:
an optical receptacle module; and
an optical plug module connectable to the optical receptacle module,
wherein the optical receptacle module comprises:
a core block having a plurality of faces;
a flexible wiring board having an external connection terminal, a first area arranged on a first face of the plurality of faces of the core block, and a second area arranged on a second face of the plurality of faces of the core block;
an optical device array mounted on the first area of the flexible wiring board, the optical device array including at least one group of a group including a plurality of optical devices for transmission and a group including a plurality of optical devices for reception arranged;
a drive circuit mounted on the second area of the flexible wiring board that drives the optical device array;
a housing to which the optical plug module is mountable that stores the core block, the optical device array, and the drive circuit such that the external connection terminal of the flexible wiring board is arranged outside the housing; and
a heat dissipation mechanism provided beneath the drive circuit and the second area of the flexible wiring board, in-line with the optical device array, the heat dissipation mechanism being thermally connected to the core block,
wherein the heat dissipation mechanism is formed of a same metal material as the core block, and
wherein the heat dissipation mechanism is separate from the housing and connected to a fourth face of the plurality of faces of the core block.

10. The electronic apparatus according to claim 8, wherein the optical connector further comprises:
a second drive circuit that drives the optical device array, wherein
the core block further has a third face, and
the flexible wiring board further has a third area arranged on the third face on which the second drive circuit is mounted.

11. The electronic apparatus according to claim 8, wherein
the heat dissipation mechanism is a heat dissipation fin.

12. The electronic apparatus according to claim 8, wherein the heat dissipation mechanism is a heat pipe.

13. The electronic apparatus according to claim 8, wherein
the core block further has a third face in parallel with the first face and the fourth face is in parallel with the second face,
the first face and the fourth face are arranged facing to each other, the second face and the third face are arranged facing to each other, and a distance between the second face and the third face is smaller than a distance between the first face and the fourth face.

14. The electronic apparatus according to claim 8, wherein
the core block is slidable along a direction perpendicular to an arrangement direction of the optical devices of the optical device array in the housing.

15. The electronic apparatus according to claim 8, wherein
a length of a transmission path between each terminal of the plurality of optical devices and each terminal of the drive circuit is 2 mm or less.

16. The optical interconnection system according to claim 9, wherein the optical receptacle module further comprises:
a second drive circuit that drives the optical device array, wherein
the core block further has a third face, and
the flexible wiring board further has a third area arranged on the third face on which the second drive circuit is mounted.

17. The optical interconnection system according to claim 9, wherein
the heat dissipation mechanism is a heat dissipation fin.

18. The optical interconnection system according to claim 9, wherein the heat dissipation mechanism is a heat pipe.

19. The optical interconnection system according to claim 9, wherein
the core block further has a third face in parallel with the first face and the fourth face is in parallel with the second face,
the first face and the fourth face are arranged facing to each other, the second face and the third face are arranged facing to each other, and a distance between the second face and the third face is smaller than a distance between the first face and the fourth face.

20. The optical interconnection system according to claim 9, wherein
the core block is slidable along a direction perpendicular to an arrangement direction of the optical devices of the optical device array in the housing.

* * * * *